United States Patent Office 3,096,311

Patented July 2, 1963

3,096,311

POLYMERIC AZIDES AND AZIDOPHTHALIC ANHYDRIDES

Stewart H. Merrill and Cornelius C. Unruh, Rochester, N.Y., assignors to Eastman Kodak Company, Rochester, N.Y., a corporation of New Jersey No Drawing. Filed July 29, 1955, Ser. No. 525,368
8 Claims. (Cl. 260—78.5)

This invention relates to soluble, film-forming azide polymers which become insoluble on exposure to light, and more particularly to those polymers where the azido group is an arylazido group, and to processes for their preparations. By azide polymers, we mean polymers which contain the azido grouping —$N_3$ which is believed to have the resonant structure $$-\overset{(-)}{N}-\overset{(+)}{N}\equiv N \rightleftarrows -N=\overset{(+)}{N}=\overset{(-)}{N}$$

cf. Bayer and Cantor, Chem. Rev., 54, page 20 (1954) and will be referred to as —$N_3$ in the chemical structures appearing hereinafter.

It is known that certain aromatic azides are light-sensitive and that physical mixtures thereof with certain colloid materials such as casein, gelatin, methyl cellulose, synthetic resins etc., when coated onto a suitable support material and exposed under an appropriate image to light, give tanned images which are insoluble and ink-receptive, and can function as printing plate surfaces. For example, a process of this kind is described by Kalle & Co. in British Patent No. 678,599, dated September 3, 1952. Such prior art processes have, however, certain drawbacks. For instance, the fact that the components, i.e. the colloid and the light-sensitive compound are separate entities makes necessary the taking of special precautions in the preparation and processing to ensure uniform distribution and proper functioning of the components, so that durable, high quality and reproducible printing surfaces are obtained.

We have now found that soluble, light-sensitive materials can be prepared in which the azido group is attached by chemical bonds to a linear polymer chain. Thus, the new polymers perform the functions of both the vehicle and the sensitizer thereby ensuring better control and reproducibility. Coatings of these polymers from their solutions on light exposure to a subject such as a line, half-tone or continuous tone image, become selectively insolubilized in the exposed areas while the unexposed areas remain soluble and are readily removable by a suitable solvent thereby reproducing the said subject or image. Furthermore, mixtures of these polymeric azides and other inert polymers, provided the selected polymers are compatible with the polymeric azides, when coated and exposed under a negative to ultraviolet light, can also form insoluble stencils. It is also within the invention to provide our new polymers with other functional groups such as carboxyl or sulfonic acid groups which serve to impart improved solubility in dilute aqueous alkali and ammonium hydroxide. Thus, exposed coatings can be more readily developed in aqueous media. The various new polymeric azides of our invention are particularly suitable for forming resist images on printing plate supports such as on aluminum, zinc, copper, magnesium and on various alloys thereof. Such resist images, we have found, are dimensionally stable, are ink-receptive, and highly suitable for printing surfaces for lithographic or other printing presses. For further details of photographic processes wherein our new polymers are advantageously employed, reference may be had to copending application Serial No. 525,271, of Stewart H. Merrill et al., filed of even date herewith, now Patent No. 2,948,610.

It is accordingly, an object of our invention to provide a new class of soluble, light-sensitive, film-forming organic polymers containing a substantial proportion of azido groups. A further object is to provide compositions of the new polymers which are particularly useful for photomechanical reproduction processes. Another object is to provide a process for preparing the new class of light-sensitive polymers. Other objects will become apparent hereinafter.

In accordance with our invention, we prepare light-sensitive film-forming azidostyrene homopolymers containing the following recurring structural unit:

(I)

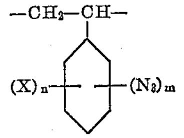

or copolymers of said azidostyrenes consisting of the following recurring structural units in random combination:

(II)

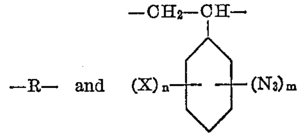

(a) (b)

wherein the ratio of II(*a*) units to II(*b*) units in each resin molecule can vary from 1:19 to 19:1, i.e. II(*b*) are present from 5 to 95 mole percent, and wherein *m* represents in each instance a digit 1 or 2, *n* represents a digit of from 0 to 2, X represents a chlorine atom, an alkyl group containing from 1 to 4 carbon atoms, e.g. methyl, ethyl, propyl, butyl, etc., an alkoxy group containing from 1 to 4 carbon atoms, e.g. methoxy, ethoxy, propoxy, butoxy, etc., and a nitro group, and R represents a unit such as ethylene, isobutylene, a 1,3-butadiene, styrene and substituted styrenes, etc., an α,β-unsaturated mono- or di-carboxylic acid unit such as acrylic acid, an α-alkylacrylic acid, maleic acid, citraconic acid, itaconic acid, etc. and the anhydrides, alkyl esters, imides, N-alkyl imides, nitriles, amides, and N-alkyl and N,N-dialkyl substituted amides of these acids, fumaric and mesaconic acids and their alkyl esters, nitriles, amides and N-alkyl and N,N-dialkyl substituted amides, vinyl alkyl ketones such as vinyl methyl ketone, vinyl halides such as vinyl chloride, vinylidene halides such as vinylidene chloride, and the like units, and wherein in each instance in the above the alkyl and alkoxy groups contain from 1 to 4 carbon atoms, by diazotizing a polyaminostyrene or a copolymer of aminostyrene and reacting the resulting diazonium salt with sodium azide, followed by separation of the azido derivative from the reaction mixture. While the intermediate aminostyrene polymers can be prepared by direct polymerization of the monomeric azidostyrene alone or with a comonomer, we prefer to derive them from the corresponding simple styrene polymers having the above structure, but without the azido group, by nitrating the styrene nucleus and then reducing the nitro derivative to the corresponding amine derivative. Where R in the above Structure I is an α,β-unsaturated di-carboxylic acid units, e.g. a 1:1 copolymer of an azido styrene and maleic acid, the copolymer can be treated with acetic anhydride to give the maleic anhydride derivative and this can then be reacted with a variety of hydroxyl- and amino-containing components, including hydroxylated azide-containing components which greatly increases the azide content of the polymer molecule, to give the corresponding ester and amide derivatives. In place of the maleic acid-azidostyrene copolymer, there can be employed citraconic or itaconic acid copolymers with the azidostyrene.

To obtain the film-forming, light-sensitive polymers of the invention, wherein the azido grouping is contained in an ester type sidechain of the polymer, as in the azidobenzoates of vinyl alcohol polymers represented, for example, by the homopolymers consisting essentially of the following recurring structural unit:

(III)

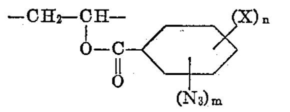

or by copolymers consisting essentially of the following recurring structural units in random combination:

(IV)

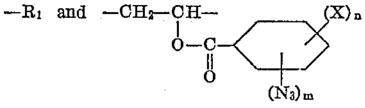

(a) (b)

wherein the ratio of IV(*a*) units to IV(*b*) in each resin molecule can vary from 1:19 to 19:1, and wherein *m, n* and X are as previously defined, and $R_1$ represents a unit such as ethylene, isobutylene, 1,3-butadiene etc., a vinyl or isopropenyl carboxylic ester, ether, ketone, carbamate or acetal, and the like units an o-, m- or p-azidobenzoyl chloride represented by the general formula:

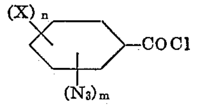

wherein *m, n* and X are as above defined, is condensed with a polyvinyl alcohol, a partially hydrolyzed polyvinyl or a poly-isopropenyl ester, e.g. partially hydrolyzed polyvinyl acetate, polyvinyl butyrate, polyvinyl benzoate, polyvinyl carbamate, polyvinyl cinnamate, polyvinyl cyanoacetate, polyvinyl azidobenzoate etc., or with a partially hydrolyzed copolymer of vinyl and isopropenyl esters, or with partial alkyl ethers of polyvinyl alcohol, or with partial polyvinyl acetals. The free hydroxyl groups in each instance can be partially or substantially completely esterified, as desired, with the azidobenzoyl chloside reactant. Where the esterification of a partially hydrolyzed polyvinyl acetate with azidobenzoyl chloride is incomplete, the final light-sensitive polymer product may contain more than two different units making up the structure such as vinylazidobenzoate units, vinyl acetate units and vinyl alcohol units.

In place of the azidobenzoyl chloride, there may be employed an azidonaphthoyl chloride, azidophenylacyl chlorides such as o-, m- or p-azidophenylacetyl chloride, etc. an azidocinnamoyl chloride, and the like, to give the corresponding polymeric derivatives of the above mentioned hydroxyl-containing polymers. The mentioned azido-group-containing acid chlorides are also capable of condensing with other hydroxylic polymeric materials, for example, with naturally occurring materials such as cellulose, starch, guar, alginic acid or with their partially esterified or etherified derivatives to give other operable light-sensitive polymers. The said acid chlorides are capable of condensing also with polymeric materials containing amino groups having free hydrogen atoms, for example, with synthetic polymers such as polyvinylamine, polyvinyl anthranilate, polymeric aminotriazoles, etc. as well as with naturally occurring polymers such as gelatin to give the corresponding light-sensitive amide derivatives.

To obtain the film-forming, light-sensitive polymers of the invention wherein the azido grouping is contained in a different ester type of sidechain of the polymers, as in the azidophthalates of vinyl alcohol polymers represented, for example, by homopolymers consisting essentially of the following recurring structural unit:

(V)

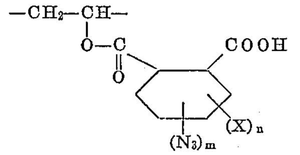

or by copolymers consisting essentially of the following recurring structural units in random combination:

(VI)

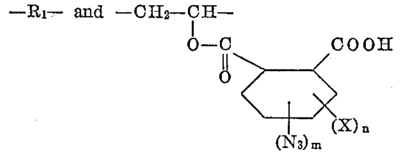

(a) (b)

wherein the ratio of VI(*a*) units to VI(*b*) units in each resin molecule can vary from 1:19 to 19:1, and wherein *m, n,* X and $R_1$ are as previously defined, an o-, m- or p-azidophthalic anhydride is condensed with a hydroxylic polymer such as mentioned in the process for preparing the light-sensitive polymers of Structures III and IV. The azidophthalic anhydride can be substituted by various azidonaphthalic anhydrides. Also, the azidophthalic and azidonaphthalic anhydrides may be condensed with amino-group-containing synthetic polymers such as polyvinylamines, polyvinyl anthranilates, polymeric aminotriazoles etc., and proteins such as gelatin, casein, etc. to give the corresponding light-sensitive amide derivatives.

To obtain the film-forming, light-sensitive polymers of the invention wherein the azido grouping is contained in a still different ester type of sidechain of the polymer as in the esters of azidophenylalkanols with maleic anhydride co-polymers consisting essentially of the following recurring structural unit:

(VII)

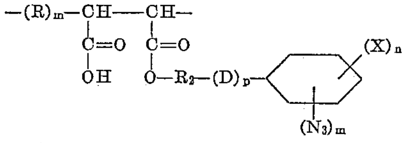

wherein *m, n,* X and R are as previously defined, $R_2$ represents an alkylene group containing from 1 to 4 carbon atoms such as $—CH_2—$, $—CH_2CH_2—$, etc., D represents an atom of oxygen, an atom of sulfur, an imino group or an alkylimino group and *p* represents a digit 0 or 1, a hydroxylated azido-group-containing compound such as an o-, m- or p-azidophenylalkanol such as represented by the general formula:

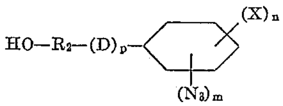

wherein *m, n,* X, $R_2$, D and *p* are as previously defined, is condensed with a maleic anhydride co-polymer, preferably with a 1:1 styrene-maleic anhydride copolymer. As typical azidobenzylalkanols, there may be employed, for example, p-azidobenzyl alcohol, o-azidobenzyl alcohol, m-azidobenzyl alcohol, 2-(azidophenyl)-ethanol, an azidophenoxyethanol, an aliphatic hydroxylated azido compound such as 2-azidoethanol or 2-azido-2-phenylethanol to give the corresponding light-sensitive esters. Also, the maleic anhydride copolymer can be replaced by polyacrylic or polymethacrylic anhydrides to give generally similar light-sensitive polymers with the said hydroxylated azido group containing compounds.

To obtain the film-forming, light-sensitive polymers of the invention wherein the azido grouping is contained in an acetal group attached to a polymer chain, as in polyvinyl azidobenzalacetals consisting essentially of the following recurring structural unit:

(VIII)
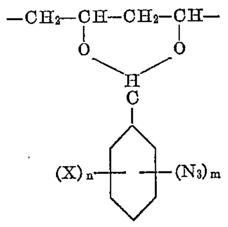

wherein *m*, *n* and X are as previously defined, a polyvinyl alcohol or a carboxylic ester thereof such as polyvinyl acetate, polyvinyl butyrate, etc. is condensed, in the presence of an acid catalyst with an azidobenzaldehyde represented by the general formula:

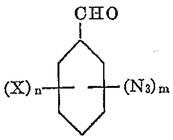

wherein *m*, *n* and X are as previously defined. The intermediate azidobenzaldehydes can be prepared, in general, by the method described by M. O. Forster and H. M. Judd, J. Chem. Soc. 97, page 254 (1910), wherein an aminobenzaldehyde is diazotized and then treated with sodium azide to give the corresponding azidobenzaldehyde. Where the polyvinyl alcohol is only partly acetalized, the final light-sensitive polymeric product will also contain some unreacted hydroxyl groups and, in the case where a polyvinyl ester is employed as the initial polymeric material and is only partially acetalized, the final light-sensitive polymer may contain both acetal and ester groups. It is also within the invention to employ partially hydrolyzed polyvinyl esters and to only partially acetalize the available hydroxyl groups. The above described light-sensitive polymeric products containing residual or unreacted hydroxyl groups can advantageously be further modified by acylation with acid chlorides or anhydrides or by carbamylation with isocyanates. For instance, a partial polyvinyl azidobenzalacetal may be acetylated, maleylated, succinoylated, phthaloylated, benzoylated, cinnamoylated, etc.

To obtain the light-sensitive polymers of the invention such as polyvinyl azidocarboxylic esters represented, for example, by the recurring structural unit:

(IX)
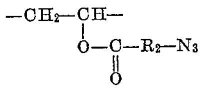

wherein $R_2$ is as previously defined, a polyvinyl halogen-substituted ester such as polyvinyl chloroacetate, polyvinyl α-chloropropionate, polyvinyl ω-chlorobutyrate, etc. is reacted with sodium azide to give the said light-sensitive polymer. The light-sensitive resins are substantially composed of units represented by Structure IX and accordingly contain a relatively high proportion of azido groups. Various starting copolymers of the said polyvinyl halogenated esters can be employed. However, light-sensitive polymers of the above described kind, we have found, are generally less stable and of a lower order of light-sensitivity than those of Structures I–VIII.

The following examples will serve further to illustrate our new light-sensitive polymers and the manner of their preparation.

*Example 1.—Polyazidostyrene*

8 cc. of concentrated hydrochloric acid were added to 20 cc. of a 10% aqueous solution of poly-p-aminostyrene hydrochloride and the mixture was cooled to −5° C. and then diazotized with aqueous sodium nitrite at 0–5° C., until a precipitate formed which would not redissolve on continued stirring to give a polystrene-p-diazonium chloride. After filtration, the cooled solution was treated with aqueous sodium azide until the gas formation ceased. After standing overnight at room temperature, the red precipitate was collected, washed with water, then washed with methanol and preserved as an alcohol paste which was soluble in dimethylformamide. Analysis of the product showed a nitrogen content of 25.0% by weight as compared with calculated theory for $C_8H_7N_3$ of 29.0%. This result indicates that the polymer contained approximately 86% by weight of the recurring structural unit:

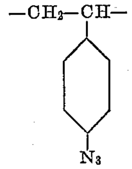

assuming that all of the nitrogen is contained as azido groups. The above prepared polymeric product was difficult to evaluate sensitometrically, due to its rather limited solubility. However, a thin coating from dimethylformamide solution, when exposed under a negative and developed showed unmistakable hardening (insolubilization) of the image areas.

*Example 2.—Azidostyrene-Maleic Acid Heteropolymer*

A solution of 20 g. of p-aminostyrene-maleic acid heteropolymer hydrochloride and 60 cc. of concentrated hydrochloric acid in 250 cc. of water was prepared. This amine was diazotized at 0–5° C. with 5.2 g. of sodium nitrite contained in 30 cc. of water. After stirring for one-half hour at 0–10° C., a solution of 5.0 g. of sodium azide in water was added. The mixture was allowed to stand several hours, after which the azide product was collected, washed well with water, and dried. The polymer obtained was soluble in moist 2-butanone, in moist dioxane and in dilute aqueous alkali solutions. Analysis of the polymer product showed that it contained 14.3% by weight of nitrogen as compared to the calculated theory for $C_{12}H_{11}O_4N_3$ of 16.1%. This result indicates the polymer contained approximately 89% by weight of the recurring structural unit:

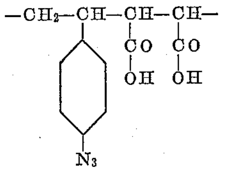

assuming that all the nitrogen is contained as azido groups. This polymeric product was evaluated sensitometrically and found to have a sensitometric speed of 40.

*Example 3.—Esterification of Partially Hydrolyzed Polyvinyl Acetate With p-Azidobenzoyl Chloride*

To a solution of 12.6 g. (0.089 mole of free hydroxyl group) of 47% hydrolyzed, high viscosity polyvinyl acetate in 250 cc. of dry pyridine, there were added 15.0 g. (0.083 mole) of p-azido-benzoyl chloride, and the mixture was heated with stirring for 4 hours at 50° C. After the solution was diluted with 3 volumes of acetone, the polymer was precipitated in cold water, reprecipitated from acetone, and vacuum dried at room temperature. Analysis of this polymer product showed that it contained 12.7% by weight of nitrogen as compared with calculated for 100% reaction of 14.2% of nitrogen. This result indicates that the polymer contains predominantly vinyl p-azidobenzoate units

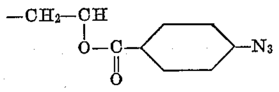

and some residual vinyl acetate and vinyl alcohol units. It had a sensitometric speed of 250, but when sensitized by incorporation therewith of a sensitizer, 2-benzoylmethylene - 1 - methyl-β-naphthothiazoline (BNTZ), the speed increased to 1800. The polymer produced excellent resist images.

The p-azidobenzoyl chloride employed in the above example was prepared by diazotizing p-aminobenzoic acid to the corresponding diazonium chloride derivative and reacting this with sodium azide to give p-azidobenzoic acid, which after recrystallization from aqueous methanol, had a melting point of 180°–182° C. (decomposes). The azidobenzoic acid was then heated for 2 hours at 60°–70° C. with 3 parts of thionyl chloride. Following vacuum evaporation to dryness, the residue was dissolved in a small quantity of hot, dry ligroin. The hot solution was filtered and cooled in ice to crystallize the p-azidobenzoyl chloride, M.P. 57°–58° C. A sample was dissolved in alkali, then treated with acid to precipitate a substance which was identified as p-azidobenzoic acid. The o- and m-azidobenzoyl chlorides can be prepared in similar manner by starting with o- and m-aminobenzoic acids.

*Example 4.—3-Azidophthalic Anhydride*

300 g. (1.42 moles) of powdered 3-nitrophthalic acid was added in portions, with stirring, to a solution of 1000 g. (5.3 moles) of anhydrous stannous chloride in 3 liters of concentrated hydrochloric acid while the temperature was maintained at 25°–30° C. The hydrochloride of the amino acid soon began to crystallize, and after being allowed to stand overnight, it was filtered and washed with a little concentrated hydrochloric acid, and vacuum dried. The yield was 217 g. (67% of theory) of 3-aminophthalic acid hydrochloride.

The above amino acid hydrochloride (217 g. or 1.0 mole) was added to a solution of 200 cc. of concentrated hydrochloric acid in 1200 cc. of water. The amine was diazotized at 0°–5° C. with 69 g. (1.0 mole) of sodium nitrite in 250 cc. of water. Then a solution of 71 g. (1.1 moles) of sodium azide in 250 cc. of water was added in small portions while maintaining the temperature below 10° C. Considerable foaming occurred. The azide suspension was mixed well, then allowed to stand in the dark for several hours. The solid was collected, washed with water, and vacuum-dried to yield 165 g. (80% of theory) of 3-azidophthalic acid, M.P. 167°–169° C. (decomposes).

The azidophthalic acid (0.80 mole) was added to a mixture of 300 cc. of acetic anhydride and 250 ml. benzene, and the slurry was heated at 65–70° for two hours with occasional swirling. The hot solution was then filtered and cooled to crystallize part of the product. The solid was collected and washed with benzene. The filtrate was evaporated by a vacuum on the steam bath to recover successive crops of crystals. The combined product was then recrystallized by dissolving it in 350 cc. of boiling anhydrous benzene, followed by the addition of 100 cc. of dry ligroin. After cooling the flask in ice, the product was collected and dried. The yield was 125 g. (83 percent of theory) of 3-azidophthalic anhydride, M.P. 124°–126° C. (decomposes).

*Example 5.—Esterification of Partially Hydrolyzed Polyvinyl Acetate With 3-Azidophthalic Anhydride*

(A) To a solution of 10.0 g. of partially hydrolyzed polyvinly acetate (47% hydrolyzed, molar basis) in 200 cc. of dry pyridine, there were added 14.2 g. of 3-azidophthalic anhydride prepared as described in Example 4. The mixture was stirred for 5 hours at 50°–60° C. and allowed to stand overnight at room temperature. The resulting solution was diluted with 50 cc. of dioxane and poured slowly into 5 liters of 4% aqueous acetic acid. The fibrous polymer obtained was washed in water and reprecipitated from dioxane into water. The dried polymer (16 g.) was soluble in dioxane and in dilute aqueous alkali hydroxide solutions. Analysis of the polymer product showed a nitrogen content of 10.3% by weight as compared with calculated for 100% reaction of 12.8% of nitrogen. This result indicated that the polymer product contained a substantial proportion of the recurring structural unit:

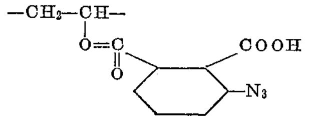

the remainder of the polymer molecule being made up of vinyl acetate units and some unreacted vinyl alcohol units. The polymer product was dissolved in a dilute aqueous ammonia solution and coated onto a grained aluminum foil. The coated foil was then exposed to a carbon arc through a line negative. After development in dilute alkali and inking by the usual method, a clean image corresponding to the negative was obtained when the inked resist image was printed onto paper.

(B) To a solution of 295 g. (2.09 moles of free hydroxyl) of 47 mole percent hydrolyzed high viscosity polyvinyl acetate in 5.9 kg. of dry pyridine was added 395 g. (2.09 moles) of 3-axidophthalic anhydride. The solution was heated with stirring for five hours at 45°–50° C., then allowed to stand overnight at room temperature.

After dilution with 1500 cc. of dioxane, the mixture was poured slowly with vigorous stirring into 40 gallons of aqueous 2.5 percent hydrochloric acid. The fine, white, fibrous polymer (600 g.) which precipitated was washed in three changes of fresh water and dried at 40°. It was soluble in acetone, dioxane, and dilute aqueous alkali. Analysis of this polymer product showed that it contained 10.8% by weight of nitrogen as compared with calculated for 100% reaction of 12.8% of nitrogen. It had a sensitometric speed through glass of 32.

(C) Three and two-tenths grams (0.046 mole of free hydroxyl) of 77 mole percent hydrolyzed medium viscosity polyvinyl acetate was soaked for three days in 50 cc. of dry pyridine. This mixture was heated to 50° C. and 9.5 g. (0.050 mole) of 3-axidophthalic anhydride were added. Heating was continued at 50°–60° C., with stirring, for six hours. After standing overnight, the solution was poured slowly into one liter of 5 percent aqueous acetic acid with vigorous stirring. A fibrous polymer precipitated. After reprecipitation from dioxane into water and washing with water, the polymer was vacuum-dried (10 g.). It was soluble in aqueous alkali. Analysis of this polymer product showed that it contained 16.7% by weight of nitrogen as compared with calculated for 100% reaction of 16.2% of nitrogen. It had a sensitometric speed through glass of 32.

Accordingly, both of the above procedures B and C gave polymer products consisting predominantly of the recurring structural unit:

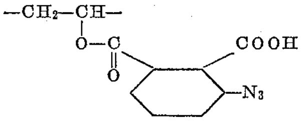

the remainder of the polymer molecule in each instance being residual vinyl acetate and vinyl alcohol units.

*Example 6.—Esterification of Partially Hydrolyzed Polyvinyl Acetate With 3(4)-Azidophthalic Anhydride (Mixed Isomers)*

(A) Polyvinyl acetate mixed azidophthalate was prepared in accordance with the procedure of Example 5 from 47% hydrolyzed polyvinyl acetate and a mixture of 3- and 4-azidophthalic anhydrides. The polymer product obtained had similar solubility properties. Analysis showed that it contained 10.7% by weight of nitrogen as compared with calculated for 100% reaction of 12.8% of nitrogen. It had a sensitometric speed through glass of 32.

The admixture isomers of azidophthalic anhydride employed in the above example, was prepared in a similar manner as set forth in Example 4 for the preparation of 3-azidophthalic anhydride, except that the initial starting material was phthalic acid which on nitration gave mixed isomeric nitrophthalic acids. The 3(4)-azidophthalic anhydride mixture melted over the range of 75°–110° C.

(B) Ten grams (0.17 mole of free hydroxyl estimated) of 88 percent hydrolyzed high viscosity polyvinyl acetate was heated at 140° in 250 cc. of N,N-dimethylformamide with stirring until solution occurred. The solution was then cooled to 50° C., and 12.0 g. of acetic anhydride (0.118 mole, calculated to give 53 mole percent total acetate on polymer) was added. The mixture was heated with stirring at 65° C. for two hours, then allowed to stand at room temperature for several hours. A portion of the polymer at this point was precipitated in ether and washed for analysis. It contained 32% by weight of $CH_3CO$-groups as compared with calculated content of 34.5% of $CH_3CO$-groups for 53 mole percent of vinyl acetate.

To the remainder of the polymer in solution heated to 45° was added an amount of azidophthalic anhydride (mixed isomers) equivalent to the free hydroxyl groups, followed by 15 cc. of pyridine. This mixture was heated with stirring at 45°–55° C. for six hours. After filtration and dilution with 100 cc. of dimethylformamide and 150 cc. of acetone, the polymer was precipitated in 10 liters of 0.3 percent aqueous hydrochloric acid, washed in fresh water, and dried at 40° C. This polyvinyl acetate azidophthalate was also soluble in acetone and dilute aqueous alkali hydroxide solution. Analysis of this polymer product showed that it contained 10.0% by weight of nitrogen as compared with calculated of 13.0% for 47 mole percent acetate and 47 mole percent azidophthalate. It had a sensitometric speed through glass of 22.

(C) 2 g. of substantially completely hydrolyzed polyvinyl acetate were dissolved in 100 cc. of hot dimethylformamide. The solution was allowed to cool slowly to about 100° C. and a solution of 20 g. of azidophthalic anhydride (a mixture of 3- and 4-isomers) in 25 cc. of dimethylformamide was added slowly with stirring. The resulting temperature of the mixture was 80° C. and this material was kept in a stoppered flask for 7 hours in a constant temperature bath at 50° C.

The solution was then poured into 3 liters of distilled water with stirring. The tan, fibrous precipitate was thoroughly washed with distilled water and dried. The nitrogen content of the sample was 10.8% by weight and a sensitometric value of 70 was obtained for a coating of the polymer using dilute ammonium hydroxide solution, both as the coating solvent and also as the development solvent to form the resist image.

*Example 7.—Esterification of Partially Hydrolyzed Cellulose Acetate With 3-Azidophthalic Anhydride*

A mixture of 10.1 g. of 3-azidophthalic anhydride and 6 g. of partially hydrolyzed cellulose acetate (24 percent acetyl) in 80 cc. of dry pyridine was stirred at room temperature for 18 hours. This solution was then diluted with 50 cc. of 2-butanone and poured slowly into agitated methanol. The fibrous polymer was collected, stirred into 200 cc. of dimethylformamide in which it formed a gel. This gel was added slowly to 2 liters of 3% aqueous acetic acid and stirred for several hours. The polymer (11 g.) was soluble in dilute aqueous alkali hydroxide solutions. Analysis of this product showed that it contained 11.7% by weight of nitrogen as compared with calculated for 100% reaction of 13.0% of nitrogen. It had a sensitometric speed through glass of 4.

*Example 8.—Reaction of 3-Azidophthalic Anhydride With Gelatin*

10 g. of gelatin was dissolved in 110 cc. of water and stirred at 50° C., while 5 g. of 3-azidophthalic anhydride was added in small portions along with sufficient 10% sodium hydroxide to maintain the pH at 8–10. The heating was continued for three hours, after which the solution was acidified with acetic acid to pH 6. The solution was evaporated to about 80 cc. by exposure to air, and the product (9 g.) was obtained by precipitation in acetone. This gelatin derivative was readily soluble in water. It could be precipitated by the addition of hydrochloric acid, then redissolved in alkali. This polymer had a sensitometric speed through glass of 4.

*Example 9.—Esterification of Ethylene-Vinyl Alcohol Copolymer With Azidophthalic Anhydride*

To a solution of 5.0 g. of ethylene-vinyl alcohol copolymer (containing 66.7 mole percent vinyl alcohol), in 75 cc. of dry pyridine was added an equivalent amount (16.3 g., 0.086 mole) of the mixed isomers of azidophthalic anhydride described in Example 6A. The mixture was heated at 55° C. for four hours and allowed to stand overnight at room temperature. After filtration, the polymer was precipitated in four liters of one percent aqueous hydrochloric acid, followed by a fresh wash and vacuum drying at room temperature. The product (14 g.) was soluble in acetone, in dioxane, and in dilute aqueous alkali hydroxide solution. Analysis of this polymer product showed it to contain 17.2% by weight of nitrogen as compared with calculated for 100% reaction of 18.8% of nitrogen. Accordingly, it consisted of vinyl 3- and 4-azidophthalate units, ethylene units and some unreacted vinyl alcohol units. It had a sensitometric speed through glass of 16.

*Example 10.—Esterification of Styrene-Maleic Anhydride Heteropolymer With β-(4-Azidophenoxy)ethanol*

To a solution of 13.0 g. (0.064 mole) of styrene-maleic anhydride heteropolymer in 130 cc. of dry pyridine at 70° C. was added 10.0 g. (0.056 mole) of β-(4-azidophenoxy)ethanol. The mixture was maintained at 70° for four hours and allowed to stand overnight at room temperature. After dilution with 50 cc. of acetone, the polymer was precipitated in two liters of ethyl ether, then reprecipitated from 250 cc. of acetone into three liters of 0.3 percent hydrochloric acid. After washing in water the product (12 g.) was dried at 40° C. It was soluble in dilute aqueous ammonia containing a small amount of ethanol. Analysis of this polymer product showed that it contained 7.5% by weight of nitrogen as compared with calculated for 100% reaction of 10.2% of nitrogen. This result indicates that the polymer was made up of a substantial proportion of the recurring structural unit:

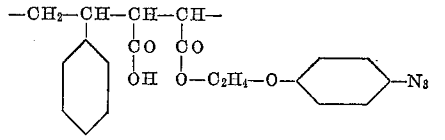

the remainder of the polymer molecule being nonesterified units. The polymer had a sensitometric speed through glass of 55.

The β-(4-azidophenoxy)ethanol employed in the above example was prepared as follows: β-(4-nitrophenoxy)-ethanol was prepared from sodium p-nitrophenate and ethylene chlorohydrin, and was hydrogenated in the presence of platinum oxide. The β-(4-aminophenoxy) ethanol (15.0 g., 0.098 mole) was dissolved in a solution of 30 cc. of concentrated hydrochloric acid in 150 cc. of water. The amine was diazotized at 0°–5° C. with 7.0 g. (0.10 mole) of sodium nitrite in 30 cc. of water. Then a solution of 7.5 g. (0.11 mole) of sodium azide in 30 cc. of water was added in portions while keeping the temperature below 10° C. The evolution of nitrogen caused considerable foaming. The precipitate which formed was allowed to stand for several hours at room temperature, then it was collected, washed with water, and vacuum dried. The yield of β-(4-azidophenoxy)ethanol, M.P.

37–38°, was 15 g. (85 percent). Analysis gave 22.7% by weight of nitrogen as compared with calculated for $C_8H_9O_2N_3$ of 23.5% of nitrogen.

*Example 11.—Esterification of Styrene-Maleic Anhydride Heteropolymer with m-Azidobenzyl Alcohol*

Four grams (0.027 mole) of m-azidobenzyl alcohol was dissolved in a solution of 8.1 g. (0.040 mole) of styrene-maleic anhydride heteropolymer in 90 cc. of dry pyridine and heated at 65° for seven hours, and after standing overnight the product was isolated and purified similarly to Example 10. The polymer was soluble in dilute aqueous ammonia. Analysis showed it to contain 5.7% by weight of nitrogen as compared with calculated for 100% reaction of 9.3% of nitrogen. This result indicates that the polymer product was made up of a substantial proportion of the recurring structural unit:

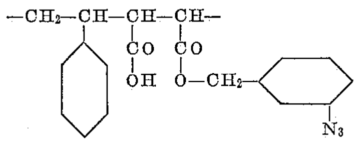

the remainder of the polymer molecule being nonesterified units. The polymer had a sensitometric speed through glass of 16.

The m-azidobenzyl alcohol employed in the above example was prepared as follows: m-nitrobenzyl alcohol was hydrogenated to the amine. The latter was then converted to the diazonium salt, followed by displacement with sodium azide to yield an oil which was taken up in ether and dried. Evaporation of the ether solution left a residue which on distillation at 92° C., at a pressure of 9 mm., yielded m-azidobenzyl alcohol which analyzed 28.6% by weight of nitrogen as compared with calculated for $C_7H_7ON_3$ of 28.2% of nitrogen.

*Example 12.—Polyvinyl Azidoacetate*

(A) To a solution of 5 g. of polyvinyl chloroacetate in 35 cc. of acetone, there were added 15 cc. of dioxane, 5 cc. of water and 4 g. of sodium azide. This mixture was heated at reflux for 3 hours. The solution was decanted from the solid salt and concentrated to one-half volume. The polymer was then precipitated in water and dried. A coating on a piece of a paper lithographic printing plate, which has a casein surface, was exposed to light under a negative and developed in acetone. An image was formed, but the speed was relatively low.

(B) To a solution of 5.0 g. of polyvinyl chloroacetate in 50 cc. of dioxane was added a solution of 3.0 g. of sodium azide in 10 cc. of water, followed by 30 cc. of ethanol. The mixture was refluxed for 15 min., and 10 cc. of water were added. After an additional 30 min. perid of refluxing, the upper liquid phase was decanted off and water was added to the heavier phase to coagulate the product. The soft polymer obtained was wsahed with water and reprecipitated from acetone into water, followed by an alcohol wash and an ether wash. The analysis of the dried polymer product showed that it contained 30.6% by weight of nitrogen and less than 1% by weight of chlorine as compared with calculated for $C_4H_5O_2N_3$ of 33.0% of nitrogen. On coating from acetone, exposure of the coating under a negative and development in acetone, a resist image was formed.

*Example 13.—m-Azidobenzaldehyde Polyvinyl Acetal*

To a solution of 5.9 g. of polyvinyl acetate in 30 cc. of dioxane, there were added 13.5 g. of m-azidobenzaldehyde followed by a dropwise addition of 0.5 g. of sulfuric acid. The solution was heated in a 40° C. bath for 24 hours. The catalyst was neutralized with 1 g. of sodium acetate and the product was precipitated in water. Reprecipitation in ether from acetone yielded a rubber-like polymer. It contained about 1% by weight of nitrogen as compared with calculated for 100% reaction of 19.3% of nitrogen. It had a sensitometric speed of 1.6.

The m-azidobenzaldehyde employed in the above example was prepared as follows: A solution of 24 g. of m-aminobenzaldehyde and 60 cc. of concentrated hydrochloric acid in 250 cc. of water was diazotized and treated with sodium azide in the usual manner. The oil that separated was taken up in ether. After a water wash and a sodium carbonate wash, the ether solution was dried and evaporated. The product distilled at 65°–70° C. at a pressure of 0.5 mm. giving a pale green liquid. Analysis showed that it contained 27.8% by weight of nitrogen as compared with calculated for $C_7H_5ON_3$ of 28.7% of nitrogen.

By proceeding as set forth in the above examples, other light-sensitive polymers having generally similar properties can be prepared with any of the mentioned intermediate natural and synthetic polymers and mentioned intermediate monomeric compounds containing one or more azido groups and containing another functional group by means of which they may be attached to the polymer molecules. Where an azidophthalic anhydride is employed as the intermediate, it has the further advantage of generating a carboxyl group on reaction with hydroxylic polymers so that alkali solubility results. This is of considerable advantage since aqueous solutions can be used for processing. The azidostyrene-maleic acid heteropolymers are likewise alkali-soluble. However, those of our light-sensitive polymers which are insoluble in water, but soluble in organic solvents can be processed readily with certain solvents such as acetone, methyl ethyl ketone, dimethylformamide, and the like.

What we claim is:

1. A film-forming organic polymer which becomes insoluble on exposure to light selected from the group consisting of (1) an azidostyrene polymer containing at least 5 mole percent of a recurring structural unit represented by the following general formula:

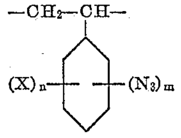

the remainder of the polymer molecule being a recurring structural unit represented by —R—, (2) a vinyl azidobenzoate polymer containing at least 5 mole percent of a recurring structural unit represented by the following general formula:

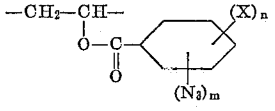

the remainder of the polymer molecule being a recurring structural unit represented by $—R_1—$, (3) a vinyl azidophthalate polymer containing at least 5 mole percent of a recurring structural unit represented by the following general formula:

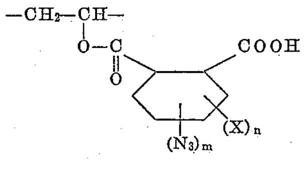

the remainder of the polymer molecule being a recurring structural unit represented by $—R_1—$, (4) a maleic acid azidoester copolymer containing at least 5 mole percent of a recurring structural unit represented by the following general formula:

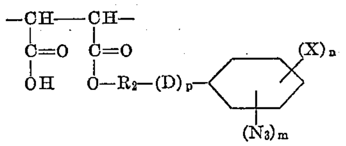

the remainder of the polymer molecule being a recurring structural unit represented by —R—, (5) a polyvinyl azidobenzalacetal containing at least 5 mole percent of a recurring structural unit represented by the following general formula:

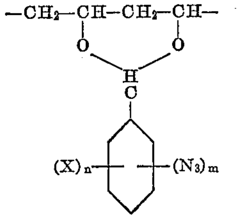

the remainder of the polymer molecule being a residual recurring structural unit selected from the group consisting of a vinyl alcohol unit, a vinyl ester unit, and a vinyl alcohol unit in combination with a vinyl ester unit, the said vinyl ester unit being a vinyl ester of a saturated fatty acid containing from 1 to 4 carbon atoms, (6) a polyvinyl azidocarboxylic acid ester containing at least 5 mole percent of a recurring structural unit represented by the following general formula:

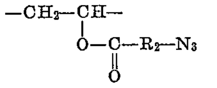

The remainder of the polymer molecule being a residual recurring unit selected from the group consisting of a vinyl chloroacetate unit, a vinyl α-chloropropionate unit and a vinyl ω-chlorobutyrate unit, (7) a cellulose carboxylic acid ester wherein at least 5 mole percent of the cellulose units have attached thereto through carbon atoms of the cellulose unit an azidoacyloxy group represented by the following general formula:

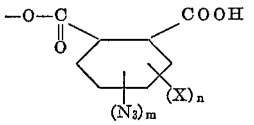

the remainder of the cellulose molecule being residual cellulose acetate units, and (8) an amidated gelatin wherein at least 5 mole percent of the gelatin units have attached thereto through a nitrogen atom of the gelatin unit an azidoacyl group represented by the following general formula:

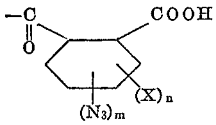

the remainder of the gelatin molecule being residual gelatin units, wherein in each occurrence *m* represents a digit of from 1 to 2, *n* represents a digit of from 0 to 2, X represents a member selected from the group consisting of a chlorine atom, an alkyl group containing from 1 to 4 carbon atoms, an alkoxy group containing from 1 to 4 carbon atoms and a nitro group, *p* represents a digit of from 0 to 1, $R_2$ represents an alkylene group containing from 1 to 4 carbon atoms, D represents a member selected from the group consisting of an oxygen atom, a sulfur atom, an imino group and an alkylimino group wherein the alkyl group contains from 1 to 4 carbon atoms, R represents a recurring structural unit selected from the group consisting of ethylene, isobutylene, butadiene-1,3, styrene, acrylic acid, methacrylic acid, maleic acid, citraconic acid, itaconic acid, maleic anhydride, acrylamide, methacrylamide, N-alkyl acrylamide, N,N-dialkyl acrylamide, N-alkyl methacrylamide, N,N-dialkyl methacrylamide, acrylonitrile, methacrylonitrile, an alkyl acrylate, an alkyl methacrylate, vinyl chloride, vinylidene chloride and a vinyl alkyl ketone, the said alkyl group in each instance containing from 1 to 4 carbon atoms, and $R_1$ represents a recurring structural unit selected from the group consisting of ethylene, isobutylene, butadiene-1,3, vinyl alcohol, a vinyl ester of a saturated fatty acid of 2 to 4 carbon atoms, a vinyl alcohol unit in combination with said vinyl ester unit, an isopropenyl ester of a saturated fatty acid of 2 to 4 carbon atoms, vinyl benzoate, vinyl carbamate, a vinyl N-alkyl carbamate, a vinyl alkyl ketone, a vinyl alkyl ether, vinyl acetaldehyde acetal, vinylpropionaldehyde acetal and vinyl butyraldehyde acetal, the said alkyl group in each instance containing from 1 to 4 carbon atoms.

2. A film-forming azidostyrene polymer which becomes insoluble on exposure to light, said polymer consisting essentially of the recurring structural unit:

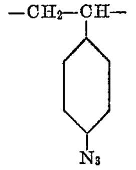

3. A film-forming vinyl ester polymer which becomes insoluble on exposure to light, said polymer consisting predominantly of the recurring structural unit:

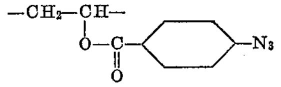

the remainder of the polymer molecule being residual vinyl acetate and vinyl alcohol units.

4. A film-forming vinyl ester polymer which becomes insoluble on exposure to light, said polymer consisting predominantly of the recurring structural unit:

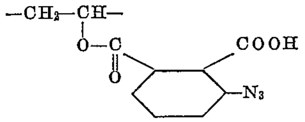

the remainder of the polymer molecule being residual vinyl acetate and vinyl alcohol units.

5. A film-forming maleic acid copolymer which becomes insoluble on exposure to light, said copolymer consisting of at least 50 mole percent of the recurring structural unit:

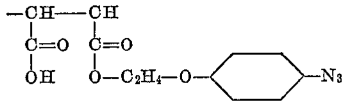

the remainder of the polymer molecule being styrene units

6. A film-forming vinyl ester polymer which becomes insoluble on exposure to light, said polymer consisting predominantly of the recurring structural units:

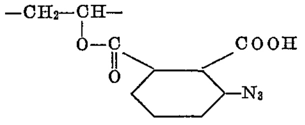

and

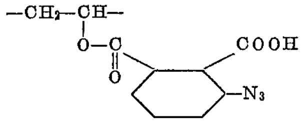

said units being present in approximately equal numbers, the remainder of the polymer molecule being residual vinyl acetate and vinyl alcohol units.

7. A process for preparing a film-forming vinyl ester polymer which becomes insoluble on exposure to light, said polymer containing at least 5 mole percent of the recurring structural unit:

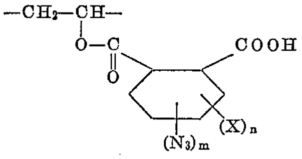

wherein $m$ represents a digit of from 1 to 2, $n$ represents a digit of from 0 to 2 and X represents a member selected from the group consisting of a chlorine atom, an alkyl group containing from 1 to 4 carbon atoms, an alkoxy group containing from 1 to 4 carbon atoms and a nitro group, which comprises heating a hydrolyzed polyvinyl carboxylic ester with an azidophthalic anhydride, in dry pyridine, and separating the said polymer, which forms, from the reaction mixture.

8. A film-forming copolymer of styrene and a different ethylenically unsaturated compound copolymerizable therewith, said copolymer containing $—N_3$ groups attached to aromatic rings of the styrene units of the copolymer.

References Cited in the file of this patent

UNITED STATES PATENTS 2,714,066 Jewett et al. ------------ July 26, 1955